United States Patent
Warnock et al.

(10) Patent No.: US 8,117,579 B2
(45) Date of Patent: Feb. 14, 2012

(54) LSSD COMPATIBILITY FOR GSD UNIFIED GLOBAL CLOCK BUFFERS

(75) Inventors: James Douglas Warnock, Somers, NY (US); Wendel Dieter, Schoenaich (DE); David E. Lackey, Jericho, VT (US); William Vincent Huott, Holmes, NY (US); Leon Jacob Sigal, Monsey, NY (US); Louis Bernard Bushard, Rochester, MN (US); Sang Hoo Dhong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 858 days.

(21) Appl. No.: 12/023,337

(22) Filed: Jan. 31, 2008

(65) Prior Publication Data

US 2009/0199036 A1 Aug. 6, 2009

(51) Int. Cl.
*G06F 17/50* (2006.01)
(52) U.S. Cl. .......................... 716/113; 716/112
(58) Field of Classification Search ........... 716/108–113
See application file for complete search history.

(56) References Cited

U.S. PATENT DOCUMENTS

| 6,725,432 | B2 * | 4/2004 | Chang et al. .................. 716/132 |
| 6,825,695 | B1 | 11/2004 | Dhong et al. |
| 6,961,886 | B2 | 11/2005 | Motika et al. |
| 7,089,474 | B2 | 8/2006 | Burdine et al. |
| 7,178,075 | B2 * | 2/2007 | Warnock et al. .............. 714/731 |
| 7,383,480 | B2 * | 6/2008 | Martin et al. ................. 714/726 |
| 2008/0022173 | A1 * | 1/2008 | Chua-Eoan et al. .......... 714/726 |

* cited by examiner

*Primary Examiner* — Jack Chiang
*Assistant Examiner* — Binh Tat
(74) *Attorney, Agent, or Firm* — Hamilton & Terrile, LLP; Michael Rocco Cannatti

(57) ABSTRACT

A method, system and program are provided for generating level sensitive scan design (LSSD) clock signals from a general scan design (GSD) clock buffer using an intermediate clock signal and one or more first mode control signals to generate a plurality of LSSD clock signals from an output section of the GSD clock buffer that receives the intermediate clock signal and the first mode control signal(s), where the GSD clock buffer is also configured to generate a plurality of GSD clock signals in response to receiving a GSD mode, generating an intermediate clock signal from the input section of the GSD clock buffer in response receiving a GSD mode signal.

13 Claims, 6 Drawing Sheets

LSSD COMPATIBILITY FOR GSD UNIFIED GLOBAL CLOCK BUFFERS

BACKGROUND OF THE INVENTION

1. Field of the Invention

The present invention is directed in general to the field of integrated circuit testing. In one aspect, the present invention relates to a system for testing different scan-based circuit componentry and/or logic that are located in a single chip.

2. Description of the Related Art

Complex very large-scale integrated circuits contain very large numbers of logic circuits that require extensive testing. In order to mitigate the complexity of the testing required, scan-based designs have been implemented. For example, level sensitive scan design (LSSD) test and diagnostic techniques are often used with VLSI chip designs that provide certain test attributes and features that make it attractive, particularly in situations where test time is not a big issue, and ease/simplicity of design is more important. In addition, general scan design (GSD) techniques are commonly used to test and diagnose circuit designs, especially in situations where high speed scan rates are desired that can not be provided by LSSD techniques. Where both GSD logic and LSSD logic are contained on the same circuit, such as can occur with systems-on-chip applications, testing problems can arise since the components designed using GSD techniques need to interface with components designed using LSSD methods. While the testing of GSD components can be carried out separately from the testing of the LSSD components, such separate testing cannot be applied in circuit designs where there are signals crossing back and forth between the LSSD logic and GSD logic because the logic for generating, sending and/or receiving these signals cannot be tested either by the standard LSSD methodology (since GSD logic is involved) or by the standard GSD methodology (since LSSD logic is also involved). Prior attempts to address this problem have proposed a special hybrid test mode for testing the boundary logic. In the hybrid test mode, clocks are fired in the following sequence; 1) a_clk in LSSD domain, 2) a single clock edge in the GSD domain, 3) b_clk in the LSSD domain. This hybrid test mode of operation adds extra complexity and cost into the test model creation, test vector generation and potentially the test procedure itself. In addition, the test tools and test models for both LSSD and GSD logic have to support an alternate mode of operation, and the chip test control unit must also provide the ability to run in this hybrid mode.

There are also timing problems associated with high-speed scan operation of integrated circuits in LSSD design. The timing problems arise because the LSSD clock signals (a_clk and b_clk) typically have varying latencies across the chip. To ensure complete non-overlap of the scan clocks and adequate pulse width for scan operation, these scan clocks are typically operated only at relatively low frequencies, with a generous margin between the falling edge of one clock (a_clk or b_clk) and the rising edge of the opposite clock (b_clk or a_clk). Prior attempts to address this problem have proposed local clock signal generation systems which use local clock buffers located at different points on the chip to generate local scan clock signals directly from the chip global clock (which is already designed as a low-skew timing reference for all circuits on the chip), thereby reducing timing differences or skew. However, these solutions, such as described in U.S. Pat. No. 6,825,695, are compatible with only one type of scan-based design (e.g., GSD), and are not compatible with other types of scan-based design (e.g., LSSD).

Accordingly, there is a need for an improved system and methodology for testing different scan-based circuit componentry and/or logic that are located in a single chip. In addition, there is a need for a local clock generation system that can be used with different types of scan-based designs on a single chip to reduce timing skew between local clock signals. Further limitations and disadvantages of conventional solutions will become apparent to one of skill in the art after reviewing the remainder of the present application with reference to the drawings and detailed description which follow.

SUMMARY OF THE INVENTION

A system and methodology are provided for generating scan test clock signals from a clock buffer that can be configured in either a GSD scan test mode or an LSSD scan test mode. In selected embodiments, a dual mode clock buffer is provided for use with at least boundary GSD logic that sends and/or receives signals to and/or from LSSD logic. In a normal or GSD scan clock mode, the dual mode clock buffer generates local GSD clock signals that can be used for full high-speed GSD testing of all GSD processor cores and/or other GSD IP blocks. However, in an LSSD scan clock mode, the dual mode clock buffer generates local LSSD-compatible clock signals so that the boundary GSD logic associated with the dual mode clock buffer can be tested along with the LSSD testing of the LSSD logic. With the local LSSD-compatible clock signals, any logic or circuitry at the boundary between the GSD-LSSD latches may also be tested during LSSD testing of the LSSD logic. The scanning, for all latches driven by the dual mode buffer as well as all the LSSD latches, is controlled by a single conventional set of LSSD scan clocks, and no special test patterns or timing requirements are necessary. In addition to being deployed for use with boundary GSD logic, the dual mode clock buffer may be used with any GSD logic, thereby enabling broader testing of the overall circuit when testing the LSSD logic. The dual mode clock buffer may include an input section (for generating an intermediate clock signal from a global clock signal and multiple control signals), an output section (for producing one or more local clock signals from the intermediate clock signal), and a mode selection control block which controls the output section to generate GSD clock signals or LSSD clock signals, depending on which scan clock mode is selected. By including a mode selection control block, a GSD unified local clock buffer in the GSD logic section can be made LSSD-compatible, such that the conventional LSSD test methodology can be applied to chips having mixed GSD and LSSD logic. With an LSSD-compatible GSD clock buffer, all the benefits of GSD testing are preserved, but the GSD logic can also be operated in an LSSD-compatible mode during testing of the LSSD logic.

BRIEF DESCRIPTION OF THE DRAWINGS

Selected embodiments of the present invention may be understood, and its numerous objects, features and advantages obtained, when the following detailed description is considered in conjunction with the following drawings, in which.

DETAILED DESCRIPTION

Figure 1:
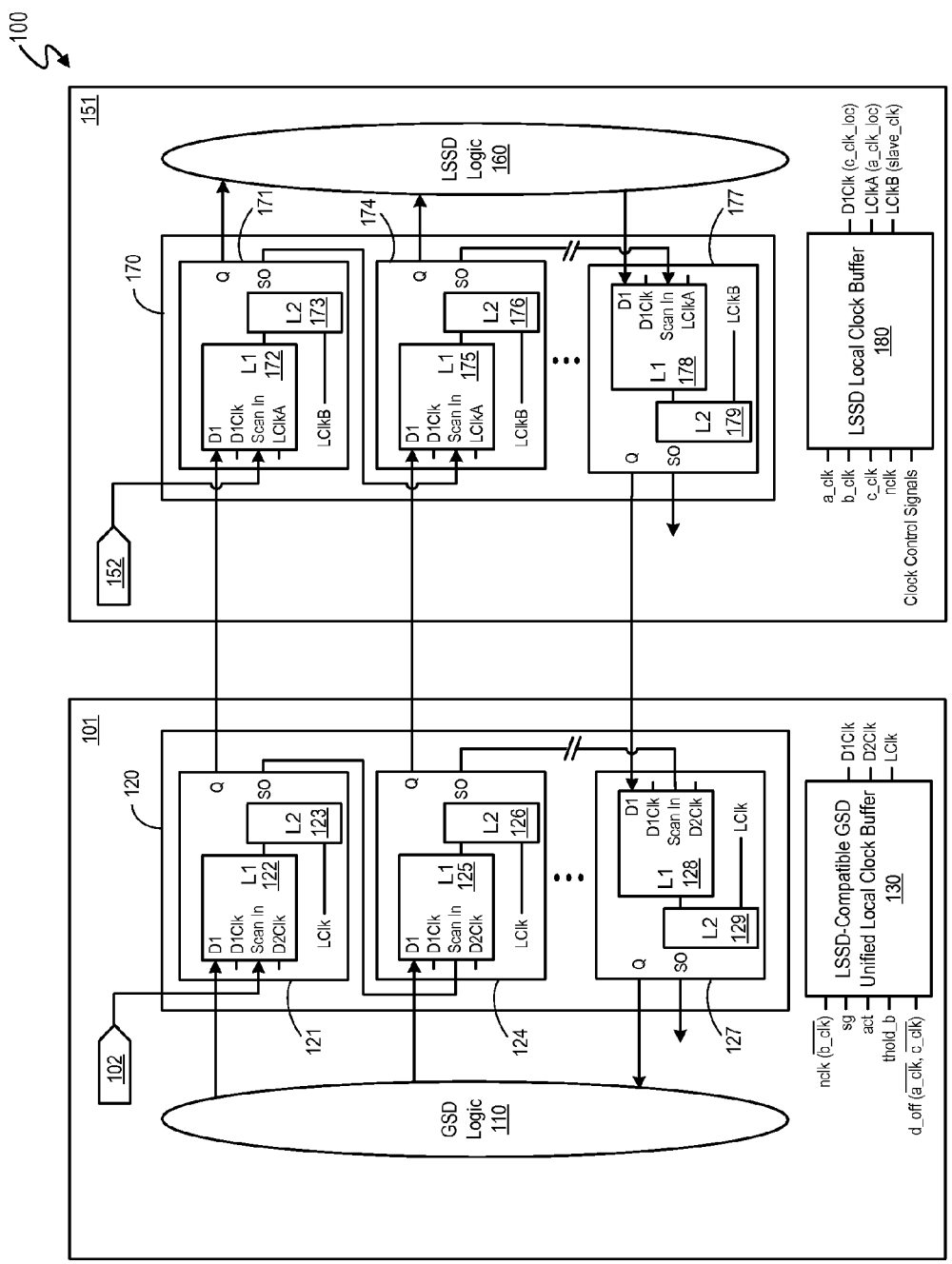
FIG. 1 illustrates in block diagram form a single integrated circuit in which different scan-based logic circuits are constructed.

A method, system and program are disclosed for making a dual mode unified local clock buffer that is compatible with both GSD and LSSD test methodologies. In an example embodiment, the dual mode unified local clock buffer is implemented in at least the boundary GSD logic as a dual mode unified GSD clock buffer which generates local GSD clock signals in a first mode, and which generates local LSSD clock signals in a second mode. In the second mode, the local LSSD clock signals may be applied to the GSD latches in the scan chain, causing the GSD latches to operate in a way which is functionally equivalent to the operation of LSSD scan chain latches. Thus, GSD latches can capture data launched by LSSD latches, and vice versa. In various embodiments, the dual mode unified local clock buffer includes an input section and an output section. The input section may include control logic and gating logic which receives multiple control signals and a global clock signal, and produces therefrom an intermediate clock signal. The output section also includes control logic which receives multiple control signals and the intermediate clock signal, and produces therefrom one or more local clocks and a scan clock from the intermediate clock signal, depending on the scan-based logic being tested. In one embodiment, the output section of the dual mode unified local clock buffer produces a first local clock signal from the intermediate clock signal, and also produces additional local clock signals from the intermediate clock signal and one or more mode control signals, where the additional local clock signals are used for scanning and testing, again depending on the scan-based logic being tested. The mode control signals may be used to selectively control the generation of the local clock signals so that the local clock buffer generates GSD-compatible local clock signals for the associated GSD logic in a GSD test mode, but generates LSSD-compatible local clock signals for the associated GSD logic in an LSSD test mode. In this way, LSSD logic can be tested along with all GSD-LSSD boundary logic since the dual mode unified local clock buffer permits the GSD logic to be operated in an LSSD-compatible mode.

Various illustrative embodiments of the present invention will now be described in detail with reference to the accompanying figures. It will be understood that the flowchart illustrations and/or block diagrams described herein can be implemented in whole or in part by dedicated hardware circuits, firmware and/or computer program instructions which are provided to a processor of a general purpose computer, special purpose computer, or other programmable data processing apparatus to produce a machine, such that the instructions (which execute via the processor of the computer or other programmable data processing apparatus) implement the functions/acts specified in the flowchart and/or block diagram block or blocks. In addition, while various details are set forth in the following description, it will be appreciated that the present invention may be practiced without these specific details, and that numerous implementation-specific decisions may be made to the invention described herein to achieve the device designer's specific goals, such as compliance with technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Various illustrative embodiments of the present invention will now be described in detail below with reference to the figures.

FIG. 1 illustrates in block diagram form a single integrated circuit 100 in which different scan-based logic circuits 101, 151 are constructed. A first group of logic circuits 101 includes a first block of logic 110, one or more scan chains 120 of a first type (e.g. GSD) associated with the logic 110, and a first local clock buffer 130 for generating local clock signals used by the scan chain 120 during scanning and testing of at least the first block of logic 110. At the second group of logic circuits 151, a second block of logic 160 and an associated scan chain of a second type (e.g., LSSD) 170 are provided, along with a second local clock buffer 180 for generating local clock signals used by the scan chain 170 during scanning and testing of the second type of logic 160. The logic 110, 160 may include combinational logic, as well as non-scannable latches, non-boundary scannable latches and other logic that is not totally combinational. In addition, there may be other logic located between the LSSD latches and the GSD latches (not shown here) which cannot be tested by pure LSSD or pure GSD techniques alone, since the latches on either side of this logic are of differing design types. When the LSSD logic 160 in the second group of logic circuits 151 is being scan tested, the first local clock buffer 130 disclosed herein may be configured to generate local clock signals for the GSD scan chain 120 so as to capture signals generated by the boundary GSD logic 110 in a way that is compatible with the LSSD testing of the LSSD logic 160. In FIG. 1, the logic is illustrated as being boundary logic, but it will be appreciated that the logic and associated scan chains may also be located internally in either or both of the logic circuit groups.

In the first group of logic circuits 101, the scan chain 120 may include a plurality of scan register latches (SRL) 121, 124, 127 associated with the logic 110. As illustrated, each scan chain 120 may include a first SRL 121, one or more intermediate SRLs 124 and a last SRL 127, all coupled in series. In the example configuration where the first group of logic circuits 101 is designed according to GSD principles and includes logic 110, the scan chain 120 may be implemented with GSD latches 121, 124, 127 which are connected in a sequence of serial input/output shift registers. Each GSD latch 121, 124, 127 may be implemented as a pair of latches forming a master-slave flip-flop, where a first (master) latch (e.g., L1 122) receives data signals "D1" and "Scan In" at data inputs, and receives local clock signals "D1Clk" and "D2Clk" at control inputs, where only one of the local clock signals "D1Clk" and "D2Clk" is active at any given time. When the D1Clk signal is high, the first latch (e.g., L1 122) drives the D1 data signal on an internal node, and when the D1Clk signal transitions from high to low, the first latch (e.g., L1 122) stores a value of the D1 data signal on the internal node, and the first latch is said to "capture" the value of the D1 data signal. When the D2Clk signal is high, the first latch (e.g., L1 122) drives the "Scan In" data signal on the internal node, and when the D2Clk signal transitions from high to low, the first latch (e.g., L1 122) stores the "Scan In" data signal on the internal node, and the first latch captures the value of the "Scan In" data signal. The second (slave) latch (e.g., L2 123) receives the output of the first latch (e.g., L1 122) at a data input, and also receives the local clock signal LClk at a control input. The second (slave) latch (e.g., L2 123) produces the output of the first latch at an output terminal "Q" when the local clock signal LClk is high, stores the output of the first latch when the local clock signal LClk transitions from high to low, and holds the stored value at the output Q when the local clock signal LClk is low. The second latch is said to "launch" the value stored by the first latch when the local clock signal LClk transitions from low to high.

The depicted integrated circuit 100 also includes a second group of logic circuits 151 designed according to LSSD principles in which one or more scan chains 170 of latches 171, 174, 177 are interspersed between and among other LSSD logic 160. In an example embodiment, the logic 160 is between and among the LSSD latches, all of which are tested together using one or more scan chains 170 to stimulate and collect test data relating to logic 160. The depicted scan chain structure 170 is essentially the same as shown in the first group of logic circuits 101, but each SRL 171, 174, 177 in the scan chain 170 is implemented in an L1/L2 LSSD configuration where the output of the L1 or master latch (e.g., 172) feeds an input of a corresponding slave L2 latch (e.g., 173). Each L1 latch has two data ports (e.g., D1 for receiving data from combinational logic and "Scan In" for receiving data from the previous SRL L2 output), and may be updated by either a first scan clock ("a_clk") or a functional clock ("clk_c"), depending on whether scanning is occurring or whether functional patterns are being run, either for test or for normal functional operation. In addition, each L2 or slave latch has an output for providing data to the combinational logic, and is updatable by a second clock ("slave_clk") which is triggered by either the scan clock ("b_clk") or the action of the global clock (nclk'). The "a_clk" and "c_clk" signals are exclusive to each other, and are always out of phase with the "slave_clk" signal. Thus, in functional mode, both the master and slave clocks are opposite in phase, but both clocks are derived from the global clock. And in scan mode, only the scan clocks a_clk and b_clk are used. The LSSD logic may also support an additional, low-speed functional test mode whereby c_clk is propagated separately from the global clock, and distributed to all LSSD registers. This would allow testing with completely non-overlapping c_clk and b_clk clock inputs.

When capturing signals from the GSD logic 110 that are sent to the LSSD logic 160, the GSD latches (e.g., 121, 124) have inputs positioned to receive the output signals from the GSD logic 110, and have outputs connected to the LSSD latch inputs in the scan chain 170 in the second group of logic circuits 151. Conversely, when capturing signals from the LSSD logic 160 that are sent to the GSD logic 110, the GSD latches (e.g., 127) are coupled on an input side to the LSSD logic 160 in the second group of logic circuits 151, and are connected on an output side to GSD latch inputs in the scan chain 120 in the first group of logic circuits. In some cases, there may be logic circuitry intervening between the GSD latch outputs and LSSD latch inputs, or between the LSSD latch outputs and the GSD latch inputs (not shown), which is also clocked with an LSSD-compatible local clock generator. With this configuration, GSD testing on the GSD logic 110 may be performed by serially inputting a GSD test vector (a pattern of zeros and ones) through the SRI 102 into the scan chain 120, then providing a sequence of functional clocks after which the resultant vector may be output from the scan chain(s) via the shift register output (SRO) (not shown). In addition, the LSSD-compatible local clock buffer 130 allows LSSD testing on the LSSD logic 160 to be performed by serially inputting a LSSD test vector through the SRI 102 into the scan chain 120, then providing a sequence of functional clocks after which the resultant vector may be output from the scan chain(s) via the SRO. Signal information from the GSD logic 110 is used during LSSD testing of the LSSD logic 160. Thus, the scan chain 120 is a boundary scan chain for test data exchanged between the GSD logic 110 and the LSSD logic 160.

While one scan chain is illustrated for each of the circuits 101, 151, any number of scan chains may be included in the logic circuits, and each chain may have any number of SRLs. In practice, it is common for scan chains to contain several thousand SRLs. In an example embodiment, the logic 110 comprises GSD logic circuits which are tested by using one or more scan chains 120 to stimulate and collect test data relating to logic 110. Though not shown, additional scan chains in the first logic circuit 101 may be serially coupled to the scan chain 120 to form a single scan chain for the first logic circuit 101. Thus, a first SRL 121 of the scan chain 120 is coupled to SRI 102, and the last SRL 127 of the first scan chain 120 is coupled to the first SRL of a second scan chain (not shown). The scan chains may then be series-coupled together until the last SRL of the last scan chain is coupled to a shift register output (SRO) (not shown).

As illustrated in FIG. 1, the GSD latches 121, 124, 127 would typically be part of a GSD scan string 120, and the LSSD latches 171, 174, 177 would typically be part of an LSSD scan string 170. In such a configuration, the outputs of the strings (GSD and LSSD) could be brought back separately to the logic built-in self-test (LBIST) logic (not shown) or one could be connected one to the other. For example, after scanning a test vector through SRI 152 and supplying functional clocks, the final LSSD scan out (SO) from the LSSD latch 177 could go to the GSD shift register input (SRI) 102, or vice versa. And if there is any additional logic between the GSD scan chain 120 and the LSSD scan chain 170, this "in between" logic can also be tested with an LSSD type of test sequence by using an LSSD-compatible local clock buffer for the "in between" logic. With such a clock buffer, the LSSD test data may be launched from the GSD side and captured over on the LSSD side, or vice versa.

Within the depicted integrated circuit 100, one or more global clock signals are typically used to provide a timing reference for the movement of data through the logic circuits 101, 151. Because of timing problems that arise when a global clock signal is distributed across the surface of the integrated circuit 100, each of the logic circuits 101, 151 includes local clock buffers 130, 180 to generate local clock signals derived from the global clock signal. As illustrated in FIG. 1, the first local clock buffer 130 and the second local clock buffer 180 are located at different points on the surface of the integrated circuit 100. Each local clock buffer uses a combination of input clock and control signals to generate local clock signals for the local scan chain circuitry and for normal functional operation. In general, the local clock signals are used to synchronize the operations of various logic structures (e.g., gates, latches, registers, and the like) of logic circuitry of the integrated circuit 100. For example, the first local clock buffer 130 may receive a global GSD clock input (nclk, or "Negative Global Clock"), and be configured by clock control signals to generate local GSD clock signals for the scan chain 120, including a first local clock signal "D1Clk," a second local clock signal "D2Clk," and a third local clock signal "LClk." And in the second logic circuit 151, the second local clock buffer 180 may generate two different "phases" of a two-phase LSSD local clock signal scheme for the scan chain 170. To this end, the second local clock buffer 180 may receive global LSSD clock inputs (a_clk, b_clk, c_clk and nclk (Negative Global Clock)), and be configured by clock control signals to generate a first local clock signal "c_clk_loc," a second local clock signal "a_clk_loc," and a third local clock signal "slave_clk."

As disclosed herein, each of the GSD local clock buffers 130 is implemented as a dual mode clock buffer to provide LSSD compatibility by designing each GSD local clock buffer 130 to include an input section and a mode-controlled output section. In response to control signals, the input section generates an intermediate clock signal, and the output section produces one or more local clock signals from the intermediate clock signal, depending on the scan-based logic being tested. In this sense, the GSD local clock buffers 130 have a unified design. While the input sections and output sections of the GSD local clock buffers 130 are substantially identical, the mode control signals applied to the output sections effectively configure the output sections to produce different local clock signals (e.g., to support different test mode operation as described below).

Figure 2:
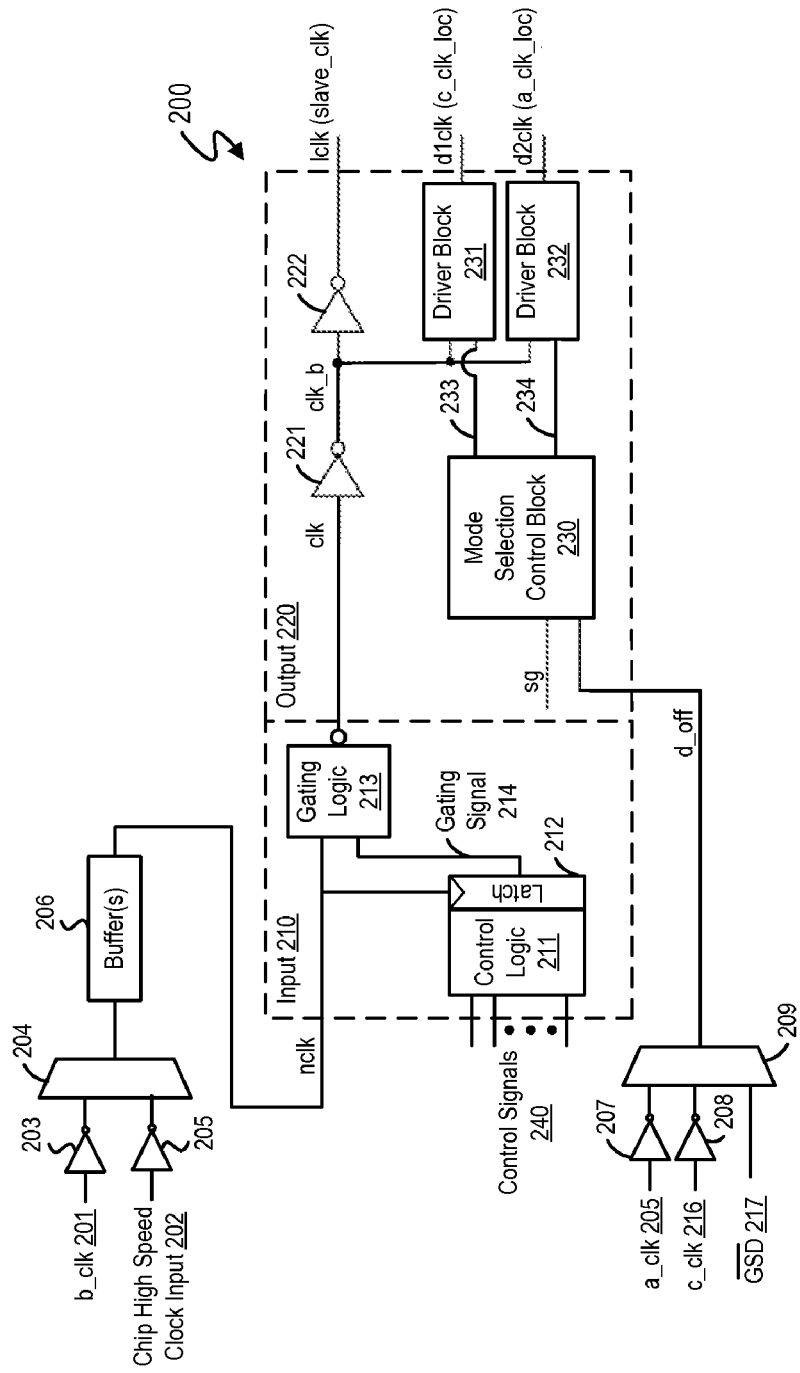
FIG. 2 illustrates in block diagram form a unified GSD local clock buffer with LSSD compatibility in accordance with selected embodiments of the present invention.

FIG. 2 illustrates in block diagram form a unified GSD local clock buffer 200 with LSSD compatibility in accordance with selected embodiments of the present invention. The depicted local clock buffer 200 includes an input section 210 and an output section 220. The input section 210 receives a global input clock (nclk) and multiple control signals 240, and generates therefrom an intermediate clock signal (clk). In accordance with selected embodiments, the input section 210 includes control logic 211 and gating logic 213. The control logic 211 uses the control signals 240 and global input clock (nclk) to produce a gating signal 214 at a latch 212 that is controlled by the global input clock (nclk). The latch 212 passes data at an input of the latch 212 to the output when the global input clock (nclk) is high, stores an input value when the global input clock (nclk) transitions from high to low, and holds the stored value at the output as the gating signal 214 when the global input clock (nclk) is low. As will be appreciated, the function of the latch 212 need not be implemented with a discrete physical structure positioned at the output of the control logic 211, but can instead can be integrated into the control logic 211 and/or the gating logic 213. As for the gating logic 213, the global input clock (nclk) and gating signal 214 are received as inputs, and an intermediate clock signal ("clk") is produced at the output. In the embodiment of FIG. 2, the intermediate clock signal ("clk") produced by the gating logic 213 is inverted with respect to the global input clock (nclk), as indicated by the inversion bubble at the output of the gating logic 213.

The output section 220 includes a first pair of inverters 221, 222 coupled in series to produce the local clock signal LClk, which is inverted with respect to the global input clock (nclk) (i.e., is out of phase with the global input clock (nclk)). In addition, the output section 220 includes a mode selection control block 230 and driver blocks 231 and 232 for producing the local clock signals D1Clk and D2Clk from the inverted intermediate clock signal (clk_b), depending on whether GSD local clock signals or LSSD local clock signals are being generated. In a first mode, the mode selection control block 230 receives a first mode control signal (e.g., d_off set to "0"), and generates in response GSD control signals 233, 234 which are applied to control the first driver block 231 and second driver block 232 so that they generate local GSD clock signals D1Clk and D2Clk in accordance with a GSD scanning mode, assuming proper operation of the control logic signals. In a second mode, the mode selection control block 230 receives a second mode control signal (e.g., d_off is controlled by a global LSSD clock signal, obtained by inverting a_clk with inverter 207, or by inverting c_clk 216 with inverter 208), and generates in response LSSD control signals 233, 234 which are applied to control the first driver block 231 and second driver block 232 so that they generate local LSSD clock signals D1Clk and D2Clk in accordance with an LSSD scanning mode, assuming proper operation of the control logic signals.

By applying the appropriate input clock signals and control signals 240, the unified GSD local clock buffer 200 can be used to generate local clock signals for both GSD and LSSD type logic testing. For example, when performing GSD scan testing on the GSD logic circuitry, the high speed global clock input 202 is inverted at inverter 205 and applied through a selection or multiplex circuit 204 and buffer 206, along with other GSD control signals 240, to the input section 210, and a GSD mode signal 217 is applied through a selector/multiplexer 209 to the output section 220. In response, the output section 220 is placed in a first GSD mode. In this mode, the local clock buffer 200 produces local GSD clock signals LClk, D1Clk and D2Clk. However, when using the GSD logic circuitry associated with the GSD local clock buffer 200 to perform LSSD scan testing on other LSSD logic circuitry, a first global LSSD clock 201 (e.g., b_clk) is inverted at inverter 203 and applied through the selection/multiplexer circuit 204 and buffer 206, along with other GSD control signals 240, to the input section 210, and a second global LSSD clock (a_clk 205) is inverted at inverter 207 and applied through a selector/multiplexer 209 to the output section 220. In response, the output section 220 is placed in an LSSD scan mode so that the local clock buffer 200 produces local LSSD scan clock signals LClk (compatible with the LSSD "slave_clk"), and d2clk (compatible with the LSSD "a_clk loc"). During high-speed functional pattern testing, or functional operation, the global clock input is applied through the selector/multiplexer circuit 204 for both LSSD- and GSD-compatible operation. Alternatively, the clock buffer also supports an LSSD-compatible low-speed functional test mode, whereby the selector/multiplexer 209 is configured to select c_clk 216 as the second global LSSD clock, inverted through inverter 208.

Figure 3:
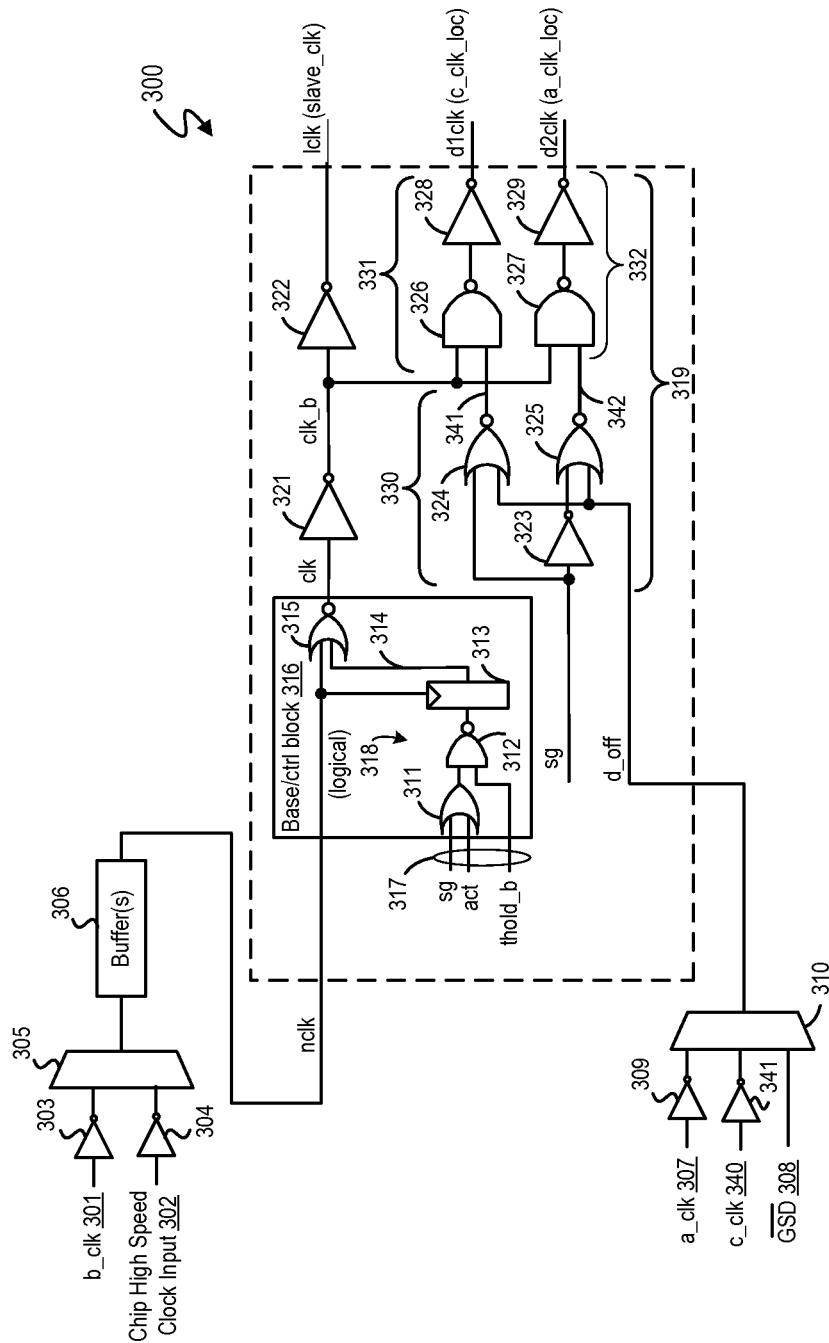
FIG. 3 illustrates in block diagram form a dual mode unified local clock buffer having control logic and gating logic for producing both GSD and LSSD local clock signals in accordance with selected embodiments of the present invention.

FIG. 3 illustrates in block diagram form a dual mode unified GSD local clock buffer 300 having control logic and gating logic for producing both GSD and LSSD local clock signals in accordance with selected embodiments of the present invention. The depicted local clock buffer (LCB) 300 includes an input section 316 which receives the global input clock (nclk) and multiple control signals 317, and generates therefrom an intermediate clock signal (clk). In accordance with selected embodiments, the input section 316 includes control logic 318 that produces a gating signal 314 using a predetermined logic function. In an example embodiment, the control logic 318 includes a logical "OR" gate 311 that receives an activation (act) signal and a scan gate (sg) signal, and a logical "NAND" gate 312 that combines the input from the OR gate 311 and a received inverted priority test signal (thold_b) into a signal that is applied to the latch 313. At the latch 313, data is passed to the latch output to generate the gating signal 314 under control of the global input clock (nclk). In this way, the control logic 318 produces a latched gate signal GATE 314 using a logic function GATE=(((sg) OR (act)) NAND (thold_b)). In addition to the control logic 318, the input section 316 includes a NOR gate 315 that performs a gating logic function under control of the GATE signal 314 to produce the intermediate clock signal clk such that clk=(nclk) NOR (GATE). In the situation when the gating signal 314 is a logic "0," the NOR gate 315 produces a time-delayed and inverted version of the global input clock (nclk) as the intermediate clock signal clk. When the gating signal 314 is a logic "1," the NOR gate 315 produces a steady logic "0" as the intermediate clock signal.

The depicted local clock buffer 300 also includes an output section 319 for generating local GSD clock signals or local LSSD clock signals, depending on the applied control signals. In particular, the output section 319 includes a first pair of inverters 321, 322 coupled in series to produce the local clock signal LClk, which is inverted with respect to the global input clock (nclk). In addition, the output section 319 includes a mode selection control block 330 and driver blocks 331 and 332 for producing the local clock signals D1Clk and D2Clk from the inverted intermediate clock signal (clk_b). In the first driver block 331, a NAND gate 326 receives and combines the clk_b signal produced by the first inverter 321 with a mode control signal 341 produced by the mode selection control block 330, and passes the NAND result to an inverter 328 which receives and inverts the output produced by the NAND gate 326, thereby producing the local clock signal D1Clk. As a result, the local clock signal D1Clk is in phase with the global input clock (nclk). At the second driver block 332, a NAND gate 327 receives and combines the clk_b signal produced by the first inverter 321 with a mode control signal 342 produced by the mode selection control block 330, and passes the NAND result to an inverter 329 which receives and inverts the output produced by the NAND gate 327, thereby producing the local clock signal D2Clk.

As indicated above, the driver blocks 331 and 332 are controlled by mode control signals 341, 342. The mode control signals 341, 342 are generated by a mode selection control block 330 which receives the scan gate (sg) signal and an additional control signal (d_off), and then applies the mode selection signals 341, 342 to the driver blocks 331 and 332, respectively. When implemented as a first NOR gate 324 (for receiving the sg signal and d_off signal) and second NOR gate 325 (for receiving the d_off signal and an inverted sg signal), the mode selection control block 330 controls the waveforms of the local clocks in response to the control signal d_off. For example, when the d_off control signal is set to logic "0," the mode selection control block 330 generates mode selection signals 341, 342 to indicate a first GSD scan mode. In this GSD scan mode (with d_off set to logic "0"), the first and second driver blocks 331, 332 provide GSD-compatible clocks to the master-slave flip-flops in the GSD scan chain. In this mode, the first driver block 331 effectively receives the inverted sg signal (sg') and the inverted intermediate clock signal (clk_b), and produces the local clock signal D1Clk such that D1Clk=(clk_b) AND (sg'). In the first GSD scan mode, the local clock signal D1Clk is a time delayed and inverted version of the intermediate clock signal clk_b in the functional mode (when sg=0), and is logic "0" in the scan test mode (when sg=1). And in the first GSD scan mode, the second driver block 332 effectively receives the sg signal and the inverted intermediate clock signal clk_b, and produces the local clock signal D2Clk such that D2Clk=(clk_b) AND (sg). Thus, the local clock signal D2Clk in the first mode is a time delayed and inverted version of the intermediate clock signal clk in the scan test mode (when sg=1), and is logic "0" in the functional mode (when sg=0).

In contrast, when the d_off control signal is controlled by an LSSD clock signal (e.g., a_clk 307 or c_clk 340), the mode selection control block 330 generates mode selection signals 341, 342 to indicate a second LSSD scan mode. In this LSSD scan mode, the first driver block 331 performs an AND gate combination of the inverted intermediate clock signal (clk_b) and the NOR combination of the sg signal (sg) and the d_off control signal, thereby producing the local clock signal D1Clk such that D1Clk=((clk_b) AND (sg NOR d_off)). In the second mode, the second driver block 332 performs an AND gate combination of the inverted intermediate clock signal (clk_b) and the NOR combination of the inverted sg signal (sg') and the d_off signal, thereby producing the local clock signal D2Clk such that D2Clk=(clk_b) AND (sg' NOR d_off). Of course, as the d_off control signal changes with the LSSD input clock signal (307), the local clock signals D1Clk and D2Clk also change. Normally, in LSSD scan mode, the sg signal would be held at 1, multiplexer 305 would be set to select the inverted b_clk input, and multiplexer 310 would be set to select the inverted a_clk input. Under these conditions, assuming non-overlapping LSSD a_clk and b_clk inputs, the local clock buffer will provide non-overlapping lclk (slave_clk) and d2clk (a_clk_loc) outputs, thereby controlling all latches in an LSSD-compatible fashion. Thus, in LSSD scan mode (but not in GSD mode), d_off=not (a_clk).

As described above, the unified GSD local clock buffer 300 can be used to generate local clock signals for both GSD and LSSD type logic testing by applying the appropriate input clock signals and control signals. For example, when implemented as the local GSD clock buffer for GSD logic circuitry, the local clock buffer 300 receives a global clock signal 302 (via inverter 304, multiplexer 305, and buffer(s) 306), along with control signals 317 and a GSD mode signal 308, to place the local GSD clock buffer 300 in a first GSD mode. In this mode, the local clock buffer 300 produces therefrom GSD local clock signals LClk, D1Clk and D2Clk from the global clock signal 302. In the GSD mode, the control logic 318 preferably produces the gating signal 314 during a single cycle of the global clock signal 302, and the gating logic 315 preferably comprises a single gate (e.g., a NAND gate or a NOR gate). In the situation where the global clock signal 302 is gated by a single gate, only three gate levels exist between the global clock signal 302 and the local clock signal LClk, and four gate levels exist between the global clock signal 302 and the local clock signal D1Clk. Further, two of the three gates between the global clock signal 302 and the local clock signal D1Clk are also in a path between the global clock signal 302 and the local clock signal LClk. As a result, the skew between these local clock signals is minimized.

However, when used for LSSD scan purposes, the local clock buffer 300 receives a first global LSSD clock signal 301 (via inverter 303, multiplexer 305, and buffer(s) 306), along with control signals 317 and a second global LSSD clock signal 307 (via inverter 309 and multiplexer 310), to place the local clock buffer 300 in a second LSSD mode. In this mode, the local clock buffer 300 receives two input global LSSD clock signals (e.g., a_clk and b_clk), and produces therefrom two-phase local LSSD clock signals (e.g., a_clk_loc and slave_clk). In particular, a first global input clock 301 (e.g., b_clk) is inverted and applied as an input to the local clock buffer 300 which is passed through gating logic 315 to the inverter pair 321, 322 to produce a first local clock signal LClk (slave_clk). In addition, a second global input clock signal 307 (e.g., a_clk) is inverted and presented at the d_off signal as a control input which the local clock buffer 300 uses to control the first driver block 331 and second driver block 332 to produce the second local clock signal D1Clk (held at zero when sg=1) and third local clock signal D2Clk (e.g., a_clk_loc), respectively.

Figure 4:
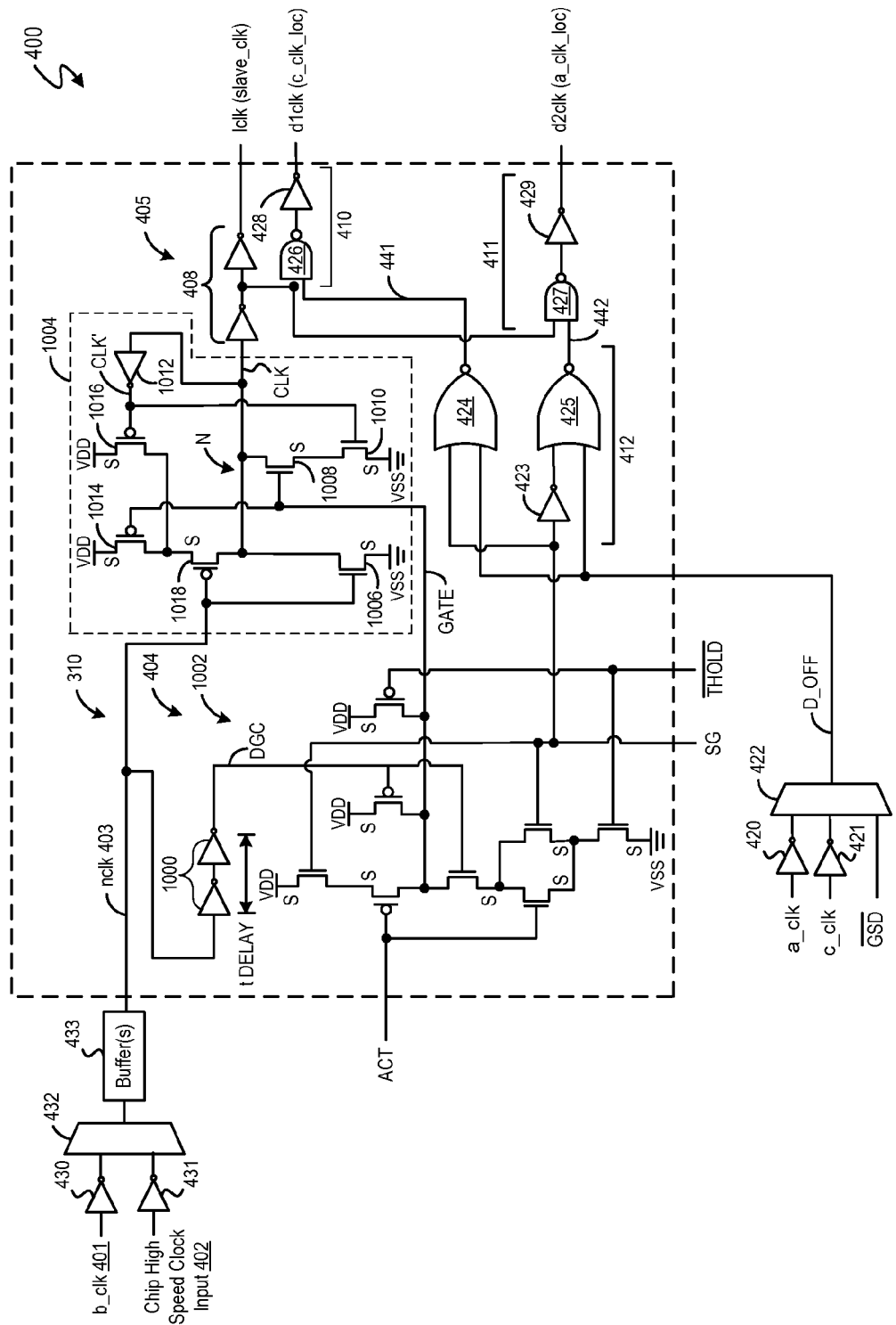
FIG. 4 is an example circuit and logic schematic of the dual mode unified local clock buffer shown in FIG. 3.

Turning now to FIG. 4, there is depicted an example circuit and logic schematic of the dual mode unified local clock buffer 400. The depicted dual mode clock buffer includes control logic 404 that receives an activation (ACT) signal, a scan gate (SG) signal, an inverted priority test (THOLD') signal and a first input clock signal 403 selected from either a first global LSSD clock signal 401 or a global GSD clock signal 402. The control logic 404 produces a GATE signal for controlling a dynamic logic gate 1004. In operation, the ACT signal is a logic "1" when the local clock signals LClk, D1Clk and D2Clk are to be derived from the first input clock signal 403 in a normal functional mode, and is a logic "0" when the first input clock signal 403 is to be "gated off" by the gating logic 1004 in the functional mode. The SG signal is a logic "1" in a scan testing mode, and a logic "0" during the functional mode. The THOLD signal, which has priority over the ACT and SG signals, is a logic "0" when the local clock signals LClk, D1Clk and D2Clk are to be derived from the first input clock signal 403, and is a logic "1" when the first input clock signal 403 is to be "gated off" by the gating logic 1004. Thus, the THOLD' signal is a logic "1" when the local clock signals LClk, D1Clk and D2Clk are to be derived from the first input clock signal 403, and is a logic "0" when the first input clock signal 403 is to be "gated off" by the gating logic 1004.

In the embodiment of FIG. 4, the control logic 404 includes a series-coupled pair of inverters 1000. A first inverter of the pair of inverters 1000 receives the first input clock signal 403, and the second inverter produces a delayed version of the first input clock signal 403 labeled "DGC" in FIG. 4. Because the invert pair 1000 creates a propagating time delay ($t_{DELAY}$), the DGC signal is a time-delayed version of the first input clock signal 403 which is delayed in time by the time period $t_{DELAY}$. The depicted control logic 404 also includes a static logic gate 1002 having several n-channel and p-channel MOS devices. The static logic gate 1002 is a CMOS logic gate that receives the ACT signal, the SG signal, the THOLD' signal, and the DGC signal, and produces the GATE signal such that GATE=DGC'+(ACT+SG)'+THOLD. As described in more detail below, when the GATE signal is a logic "0," the local clock signals LClk, D1Clk and D2Clk are to be derived from the first input clock signal 403, and when the GATE signal is a logic "1," the first input clock signal 403 is to be gated off by the gating logic 1004.

In the embodiment of FIG. 4, the logic gate 1004 implements a gating logic function to produce an intermediate clock signal "CLK" at the node N. An n-channel MOS device 1006 of the logic gate 1004 is coupled between node N and the power supply voltage $V_{SS}$, and receives the first input clock signal 403 at a gate terminal. The n-channel MOS device 1006 discharges the node N when the first input clock signal 403 is high. The logic gate 1004 also includes an n-channel MOS device 1008, an n-channel MOS device 1010 connected in series between node N and the power supply voltage $V_{SS}$, and an inverter 1012. The inverter 1012 receives the intermediate clock signal CLK and produces an inverted version of the intermediate clock signal CLK'. The n-channel MOS device 1008 receives the GATE signal at a gate terminal, and the n-channel MOS device 1010 receives the inverted intermediate clock signal CLK' produced by the inverter 1012 at a gate terminal. The series-coupled n-channel MOS devices 1008 and 1010 form an electrically conductive path between node N and the power supply voltage $V_{SS}$ when the GATE signal is high and the intermediate clock signal CLK (at the dynamic node N) is low. This action prevents node N from floating when the first input clock signal 403 transitions from high to low, the GATE signal is high, and the intermediate clock signal CLK is low.

The logic gate 1004 also includes p-channel MOS devices 1014, 1016, and 1018. The p-channel MOS devices 1014 and 1016 are connected in parallel with one another, and in series with the p-channel MOS device 1018, between node N and the power supply voltage $V_{DD}$. The p-channel MOS device 1014 receives the GATE signal at a gate terminal, the p-channel MOS device 1016 receives the CLK' signal produced by the inverter 1012 at a gate terminal, and the p-channel MOS device 1018 receives the first input clock signal 403 at a gate terminal. The node N is charged to the power supply voltage $V_{DD}$ by the series-coupled p-channel MOS devices 1014 and 1018 when the GATE signal is low and the first input clock signal 403 is low (e.g., as the first input clock signal 403 transitions from high to low). The series-coupled p-channel MOS devices 1016 and 1018 form an electrically conductive path between node N and the power supply voltage $V_{DD}$ when the intermediate clock signal CLK (at node N) is high and the first input clock signal 403 signal is low. This action prevents the node N from floating when the intermediate clock signal CLK (at node N) is high, the first input clock signal 403 is low, and the GATE signal is high (e.g., as the GATE signal transitions from low to high after the time delay $t_{DELAY}$). The logic gate 1004 essentially performs an AND-OR-INVERT (AOI) logic function on the first input clock signal 403 and GATE input signal, and produces the intermediate clock signal CLK at the dynamic node N such that CLK=(nclk) NOR (GATE AND CLK') where CLK' is the logical inverse of a current value of the CLK signal. This logic, combined with the resetting nature of the GATE input, replaces the function of the latch 313 in FIG. 3.

In the dual mode unified local clock buffer 400, an output section 405 is provided that includes an inverter pair 408, a first driver block 410, a second driver block 411, and a mode selection control block 412 for producing the local clock signals D1Clk and D2Clk from the inverted intermediate clock signal (CLK') a control signal (SG), and any additional input clock signal applied to the D_OFF signal line. As disclosed herein, the output section 405 generates GSD local clock signals LClk, D1Clk and D2Clk from the first input clock signal 403 when the GSD mode signal (e.g., GSD is a logical "1") is applied to the output section 405. In an example implementation shown in FIG. 4, when the inverted GSD mode signal (GSD') has a logical "0" value that is applied (via multiplexer 422) to the D_OFF signal line, the dual mode unified local clock buffer 400 operates in a normal mode for system operations when running functional test patterns at high speed and when performing GSD testing. Under these circumstances, the dual mode unified local clock buffer 400 behaves as a unified GSD local clock buffer where the global clock signal 402 is applied (via inverter 431, multiplexer 432, and buffers 433) to the first input clock signal line 403 to generate GSD local clock signals which are used to scan data through the GSD scan chains for GSD testing when the scan gate control signal (SG) is set to a logical "1." In this mode, the activation control signal (ACT) is a local clock gate that used to keep the clock from firing in functional operation.

To support LSSD scan operation with the dual mode unified local clock buffer 400, a different set of control and clock input signals are applied which cause the output section 405 to generate LSSD local clock signals LClk (slave_clk), and D2Clk ("a_clk local") from the first global input clock (b_clk) 401 when a second global input clock (a_clk) is applied to the output section 405. In the example implementation shown in FIG. 4, the first global input clock signal (e.g., b_clk) is inverted at inverter 430, and the inverted signal (b_clk_b) is fed into the main clock tree (driving the first input clock signal line 403 to all local clock buffers) by use of a two-to-one multiplexer 432. In addition, the second global input clock signal (e.g., a_clk, or c_clk) is inverted at inverter (420 or 421), and that inverted signal (a_clk_b, or c_clk_b) is then applied through the selection circuit 422 to drive the D_OFF signal line. In addition, additional test control logic could be inserted into the path from the global input clock signals. For example, additional control logic could be included to allow selective control of the D_OFF signal line for specific regions of a chip.

During normal system operation, or while running high-speed functional test patterns, the multiplexer 432 would generally be configured to select the chip clock input and then feed the selected signal into the global clock distribution of the chip, while multiplexer 422 would be configured to remotely select the GSD' control signal input.

Figure 5:
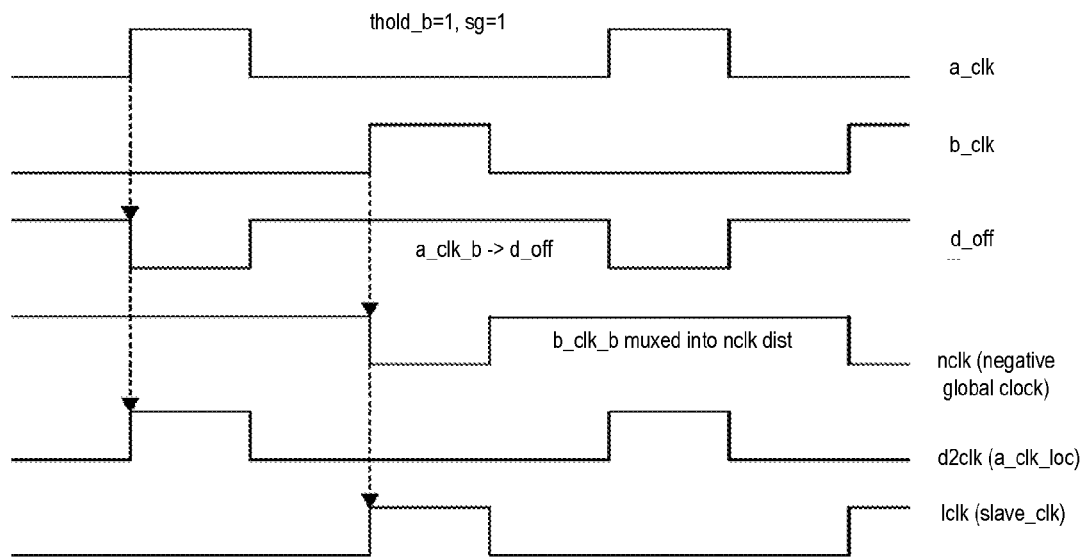
FIG. 5 is a timing diagram depicting operation of a dual mode unified GSD local clock buffer in an LSSD scan mode.

During LSSD scan mode, the multiplexer 432 is configured to select the inverted first global input clock (b_clk) 401 input, feeding this signal into first input clock signal line 403 for the dual mode unified local clock buffer 400. When scanning data through the scan chains during LSSD testing, the scan gate control signal (SG) and inverted priority test signal (thold_b) are set to a logical "1," and the D_OFF signal line is controlled by the second global input clock signal (a_clk). The LSSD scanning mode waveforms generated by the dual mode unified local clock buffer 400 are shown in FIG. 5, which shows the input signals (a_clk, b_clk, d_off and n_clk) and output signals d2clk (a_clk_loc) and lclk (slave_clk) during LSSD scanning mode. As these waveforms show, pulses in the second global input clock signal (a_clk) are inverted (e.g., by inverter 420) to drive the d_off signal "low" which, in turn, drives the d2clk signal "high" in the LSSD scan mode (when thold_b and sg are forced "high"). However, when the second global input clock signal (a_clk) pulse is finished (goes "low"), its inverted value (a_clk_b) is applied to the d_off signal, which forces the d2clk signal "low," thereby allowing a subsequent pulse in the first global input clock signal (b_clk) to drive the nclk signal "low" which, in turn, drives the lclk signal high. In this LSSD scanning mode, the d2clk and lclk signals control the data movement along the scan chain, and are functionally equivalent to the local LSSD clock signals, a_clk and b_clk, respectively. Thus, the d2clk and lclk signals in FIG. 5 are parenthetically identified as local LSSD clock signals a_clk_loc and slave_clk, respectively. By applying the d2clk and lclk signals to the GSD scan chain latches, data can be moved along the LSSD scan chains and into the GSD scan chains, and vice versa (GSD to LSSD) without any problems, using a single unified a_clk and b_clk distribution for all LSSD and GSD (with unified local clock buffer) latches.

Figure 6:
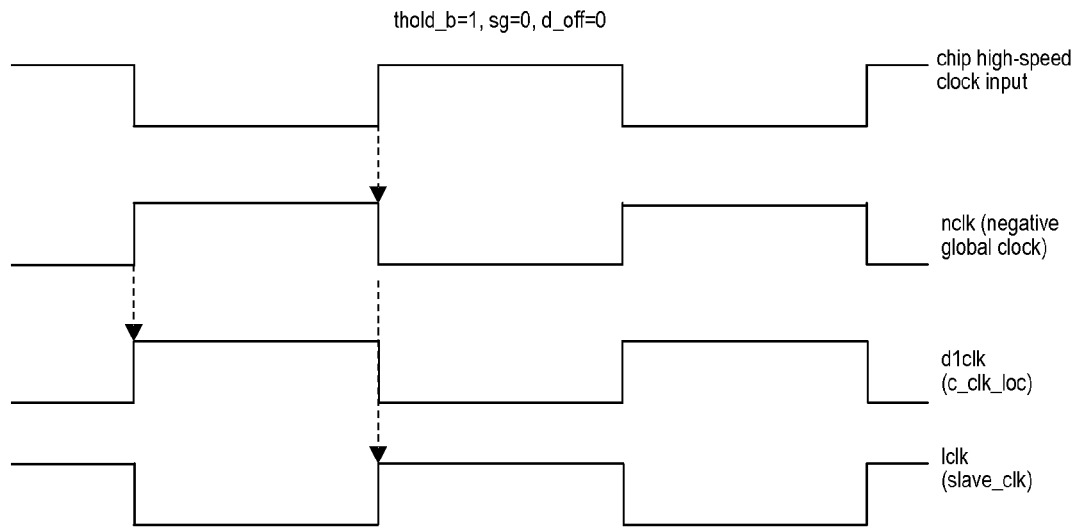
FIG. 6 is a timing diagram depicting operation of a dual mode unified GSD local clock buffer running high-speed functional test patterns or operating in normal functional mode in a way which is compatible with both GSD and LSSD logic.

Once the scan data is scanned in through the LSSD and GSD scan chains, functional clocks can be applied to perform LSSD testing on the logic. In the LSSD testing mode, the scan gate signal (SG) is set to a logical "0" and the inverted priority test signal (thold_b) is set to a logical "1." The LSSD functional test mode waveforms generated by the dual mode unified local clock buffer 400 are shown in FIG. 6, which shows the input signal (n_clk) and output signals d1clk (c_clk_loc) and lclk (slave_clk) during LSSD functional test mode. For high-speed testing, the multiplexer 432 is configured to select the inverted second global input clock ("chip clock input") 402 input, feeding this signal into first input clock signal line 403 for the dual mode unified local clock buffer 400. In addition, multiplexer 422 is configured to select the GSD' signal making sure that the d_off signal line is held at 0 for the dual mode unified local clock buffer 400. As these waveforms in FIG. 6 show, when nclk is high, the d1clk (c_clk_loc) signal is "high" in the LSSD functional test mode. However, when nclk goes "low," the d1clk (c_clk_loc) signal goes "low," and the lclk (slave_clk) signal is driven high. This sequence of local clocks is compatible with both GSD and LSSD latches, since in functional mode the GSD clocks (d1clk and lclk) are logically equivalent to the LSSD clocks (c_clk and slave_clk).

Figure 7:
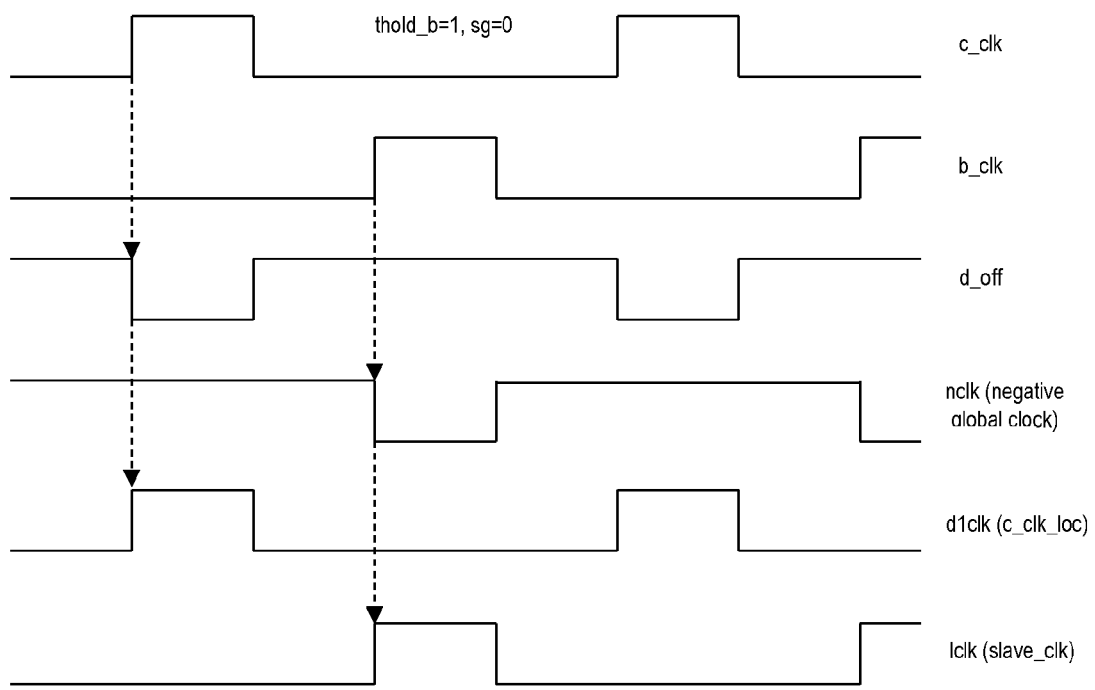
FIG. 7 is a timing diagram depicting operation of a dual mode unified GSD local clock buffer running low speed functional test patterns in a low-speed LSSD functional test mode with non-overlapped clocks.

In selected embodiments, non-overlapping functional clocks may also be supplied to perform low-speed LSSD functional testing on the logic. In this mode, the scan gate signal (SG) is set to a logical "0," the inverted priority test signal (thold_b) is set to a logical "1" and the D_OFF signal line is controlled by the global LSSD input clock signal (c_clk). The LSSD slow-speed functional test mode waveforms generated by the dual mode unified local clock buffer 400 are shown in FIG. 7, which shows the input signals (c_clk, b_clk, d_off and n_clk) and output signals d1clk (c_clk loc) and lclk (slave_clk) during LSSD functional test mode. As these waveforms show, pulses in the second global input clock signal (c_clk) are inverted (e.g., by inverter 421) to drive the d_off signal "low" which, in turn, drives the d1clk signal "high." However, when the second global input clock signal (c_clk) pulse is finished (goes "low"), its inverted value (c_clk_b) is applied to the d_off signal, which forces the d1clk signal "low," thereby allowing a subsequent pulse in the first global input clock signal (b_clk) to drive the nclk signal "low" which, in turn, drives the lclk signal high. It can be seen that this sequence of local clocks is compatible with both GSD and LSSD latches, since in functional mode the GSD clocks (d1clk and lclk) are logically equivalent to the LSSD clocks (c_clk and slave_clk), and furthermore that this mode of operation provides a means of testing the logic at low speed with non-overlapping functional clocks.

As seen from the foregoing, the a_clk and b_clk signals are fed into the dual mode unified local clock buffer 400 during the LSSD scan mode. In the scan waveforms, with sg "high", when the a_clk and b_clk are both "low," then the lclk, d1clk and d2clk signals are all "low." However, when the a_clk signal goes "high," the d2clk signal goes "high". Likewise, when the b_clk signal goes high, the lclk goes high. Thus, the dual mode local clock buffer responds to the a_clk and b_clk signals in a way which is compatible with LSSD scan sequences.

With the LSSD scan and functional test modes disclosed herein, the GSD local clock signals (d1clk, d2clk and lclk) which are applied to the GSD latches in the scan chain are forced to match the LSSD local clock signals (c_clk_loc, a_clk_loc, and slave_clk). As a result, the GSD latches operate in a way which is functionally equivalent to the way LSSD latches operate. Thus, GSD latches can capture data launched by LSSD latches, and vice versa with no functional issues. As a result, the disclosed clocking scheme maintains the benefits of the GSD clocking scheme, while also providing an LSSD-compatible mode for test flexibility and simplification.

By now it will be appreciated that there has been provided a method and systems for using a general scan design (GSD) clock buffer to generate level sensitive scan design (LSSD)

clock signals. As disclosed, the GSD clock buffer includes an input section that is configured to generate an intermediate clock signal in response to a first input clock signal and one or more first input control signals. In an example implementation, the input section includes control logic that produces a gating signal from the first input control signals and the first input clock signal, and gating logic that produces an intermediate clock signal from the first input clock signal and the gating signal. The GSD clock buffer also includes an output section that is coupled to receive the intermediate clock signal, a second input clock signal and one or more first input control signals, and that generates the LSSD clock signals. In the output section, a first circuit (e.g., a series-coupled inverter pair) is provided that generates at least a first LSSD clock signal (e.g., an LSSD slave clock signal) in response to the intermediate clock signal. The output section also includes a driver block circuit that coupled to receive the mode control signal and to generate in response a plurality of LSSD clock signals from the intermediate clock signal and at least the mode control signal. In an example implementation, the driver block includes first and second drivers, where the a first driver is configured to receive an inverted intermediate clock signal and generate an LSSD functional clock signal in response to the mode control signal, and where the second driver is configured to receive the inverted intermediate clock signal and generate an LSSD master clock signal in response to the mode control signal. Finally, the output section includes a mode selection control section is provided that generates a mode control signal (which may be a plurality of mode control signals) in response to a second input clock signal and at least one of the first input control signals. To generate GSD clock signals, the output section in the GSD clock buffer is further configured to receive an intermediate GSD clock signal generated from a GSD input clock signal, and to generate a plurality of GSD clock signals from the output section of the GSD clock buffer that receives the intermediate GSD clock signal and at least a second mode control signal.

In another form, there is provided method and system for testing general scan design (GSD) logic using level sensitive scan design (LSSD) clock signals generated from a dual mode clock buffer. As disclosed, test data is scanned into a scan chain formed from GSD scan register latches associated with the dual mode clock buffer by generating first and second LSSD clock signals from the dual mode clock buffer and applying the first and second LSSD clock signals to each of the plurality of GSD scan register latches. In selected embodiments, the first and second LSSD clock signals are generated by first generating an intermediate clock signal from an input section of the dual mode clock buffer in response to a first input clock signal and one or more first input control signals; generating a mode control signal from a mode selection control section of the dual mode clock buffer in response to a second input clock signal and a scan gain control signal being "on"; and generating a master LSSD clock signal and a slave LSSD clock signal from an output section of the GSD clock buffer in response to the intermediate clock signal and at least the mode control signal. When applying the first and second LSSD clock signals to the GSD scan latches, a master LSSD clock signal may be applied to a master latch in each GSD scan register master-slave flipflop, and a slave LSSD clock signal may be applied to a slave latch in each GSD scan register master-slave flipflop. Once the test data is scanned in, the GSD logic is functionally tested by generating a functional LSSD clock signal from the dual mode clock buffer and applying the functional LSSD clock signal to each of the plurality of GSD scan register latches, thereby generating test result data in the plurality of GSD scan register latches. In selected embodiments, the functional LSSD clock signal is generated by first generating an intermediate clock signal from an input section of the dual mode clock buffer in response to a global input clock signal and one or more first input control signals; generating a mode control signal from a mode selection control section of the dual mode clock buffer in response to a second input clock signal and a scan gain control signal being "off"; and generating a functional LSSD clock signal and a slave LSSD clock signal from an output section of the GSD clock buffer in response to the intermediate clock signal and at least the mode control signal. When applying the functional LSSD clock signal to the GSD scan register latches, a functional LSSD clock signal may be applied to a master latch in each GSD scan register latch, and a slave LSSD clock signal may be applied to a slave latch in each GSD scan register latch. After the test is performed, the test result data is scanned out of the GSD scan register latches associated with the dual mode clock buffer by applying the first and second LSSD clock signals from the dual mode clock buffer to each of the plurality of GSD scan register latches.

As will be appreciated by one skilled in the art, the present invention may be embodied in whole or in part as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium. For example, the control and clock signal input selection functions may be implemented in software that is centrally stored in system memory or executed as part of the operating system or hypervisor.

The foregoing description has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification and example implementations provide a complete description of the manufacture and use of the composition of the invention. Since many embodiments of the invention can be made without departing from the spirit and scope of the invention, the invention resides in the claims hereinafter appended.

What is claimed is:

1. A method for generating level sensitive scan design (LSSD) clock signals from a general scan design (GSD) clock buffer, comprising:
   generating a first input clock signal from a clock circuit in a computer;
   generating an intermediate clock signal from an input section of the GSD clock buffer in response to the first input clock signal and one or more first input control signals by:
   receiving a first clock signal that is derived from a first global LSSD clock signal,
   generating a gating signal based on the first clock signal and at least the one or more first input control signals, and
   producing the intermediate clock signal based on the one or more first input control signals and the gating signal;

generating a mode control signal from a mode selection control section of the GSD clock buffer in response to a second input clock signal and at least one of the first input control signals;

generating a plurality of LSSD clock signals from an output section of the GSD clock buffer in response to the intermediate clock signal and at least the mode control signal.

2. The method of claim 1, further comprising:

generating an intermediate clock signal from the input section of the GSD clock buffer in response to a GSD input clock signal and one or more GSD input control signals;

generating a second mode control signal from the mode selection control section of the GSD clock buffer in response to a GSD mode signal and at least one of the GSD input control signals;

generating a plurality of GSD clock signals from an output section of the GSD clock buffer that receives the intermediate clock signal and at least the second mode control signal.

3. The method of claim 1, where generating a mode control signal comprises:

receiving a second clock signal that is derived from a second global LSSD clock signal;

receiving a scan gate control signal; and generating a first mode control signal when the scan gate control signal indicates that data is to be scanned into a GSD scan chain associated with the GSD clock buffer.

4. The method of claim 1, where generating a mode control signal comprises:

receiving a second clock signal that is derived from a second global LSSD clock signal;

receiving a scan gate control signal; and generating a second mode control signal when the scan gate control signal indicates that LSSD testing is to be applied to data captured by a GSD scan chain associated with the GSD clock buffer.

5. The method of claim 1, where generating a plurality of LSSD clock signals comprises:

generating a first local LSSD clock signal for clocking functional data into one or more master latches in a GSD scan chain associated with the GSD clock buffer, and generating a second local LSSD clock signal for clocking said functional data from said one or more master latches into a corresponding one or more slave latches in the GSD scan chain.

6. The method of claim 1, where generating a plurality of LSSD clock signals comprises:

generating a first local LSSD clock signal for clocking scan data into one or more master latches in a GSD scan chain associated with the GSD clock buffer, and generating a second local LSSD clock signal for clocking said scan data from said one or more master latches into a corresponding one or more slave latches in the GSD scan chain.

7. A general scan design (GSD) clock buffer for generating level sensitive scan design (LSSD) clock signals, comprising:

an input section configured to generate an intermediate clock signal in response to a first input clock signal and one or more first input control signals, the input section comprising:

control logic coupled to receive the one or more first input control signals and the first input clock signal, and configured to produce therefrom a gating signal, and gating logic coupled to receive the first input clock signal and the gating signal, and configured to produce the intermediate clock signal dependent upon the first input clock signal and the gating signal; and an output section coupled to receive the intermediate clock signal, a second input clock signal and one or more first input control signals, the output section comprising:

a first circuit configured to generate at least a first LSSD clock signal in response to the intermediate clock signal;

a mode selection control section configured to generate a mode control signal in response to a second input clock signal and at least one of the first input control signals; and a driver block circuit coupled to receive the mode control signal and configured to generate in response a plurality of LSSD clock signals from the intermediate clock signal and at least the mode control signal.

8. The GSD clock buffer of claim 7, where the output section is further configured to receive an intermediate GSD clock signal generated from a GSD input clock signal, and to generate a plurality of GSD clock signals from the output section of the GSD clock buffer that receives the intermediate GSD clock signal and at least a second mode control signal.

9. The GSD clock buffer of claim 7, where the first circuit comprises a pair of series-coupled inverters coupled to receive the intermediate clock signal and to generate an LSSD slave clock signal.

10. The GSD clock buffer of claim 7, where the driver block circuit comprises:

a first driver coupled to receive an inverted intermediate clock signal, and configured to generate an LSSD functional clock signal in response to the mode control signal, and a second driver coupled to receive the inverted intermediate clock signal, and configured to generate an LSSD master clock signal in response to the mode control signal.

11. The GSD clock buffer of claim 10, where the mode selection control section generates a mode control signal comprising a first mode control signal and a second mode control signal, the mode selection control section comprising:

an inverter coupled to receive a scan gate control signal and to generate an inverted scan gate control signal;

a first NOR gate circuit coupled to receive the scan gate control signal and the second input clock signal, and to generate the first mode control signal which is provided to the first driver; and a second NOR gate circuit coupled to receive the inverted scan gate control signal and the second input clock signal, and to generate the second mode control signal which is provided to the second driver.

12. The GSD clock buffer of claim 11, where first driver comprises a NAND gate circuit coupled to an inverter circuit, where the NAND gate circuit is coupled to generate a first NAND output from the inverted intermediate clock signal and the first mode control signal, and where the inverter circuit is coupled to generate the LSSD functional clock signal from the NAND output.

13. The GSD clock buffer of claim 11, where second driver comprises a NAND gate circuit coupled to an inverter circuit, where the NAND gate circuit is coupled to generate a first NAND output from the inverted intermediate clock signal and the second mode control signal, and where the inverter circuit is coupled to generate the LSSD master clock signal from the NAND output.

* * * * *